United States Patent [19]

Yamada

[11] Patent Number: 5,177,365

[45] Date of Patent: Jan. 5, 1993

[54] CHARGED PARTICLE BEAM EXPOSURE DEVICE FOR IMPROVING THE HEATING STATE OF BLOCK MASK

[75] Inventor: Akio Yamada, Kawasaki, Japan

[73] Assignee: Fujitsu Limited, Kawasaki, Japan

[21] Appl. No.: 817,074

[22] Filed: Jan. 6, 1992

[30] Foreign Application Priority Data

Jan. 11, 1991 [JP] Japan ................................. 3-1804

[51] Int. Cl.⁵ ........................................... H01J 37/302
[52] U.S. Cl. .................................. 250/492.2; 250/398
[58] Field of Search ................. 250/492.2, 492.23, 398

[56] References Cited

U.S. PATENT DOCUMENTS

4,213,053  7/1980  Pfeiffer ............................ 250/492.2
4,687,940  8/1987  Ward et al. ...................... 250/492.2

Primary Examiner—Jack I. Berman
Attorney, Agent, or Firm—Staas & Halsey

[57] ABSTRACT

A charged particle beam exposure device includes a charged particle optical column for selecting one or more minute block patterns from a plurality of block patterns formed on a block mask, and for irradiating a charged particle beam having a specific sectional shape determined by the selected block pattern onto a surface of a substrate to be processed. The charged particle beam exposure device comprises a beam control unit, provided between a beam generation unit and the block mask, for uniformly irradiating the charged particle beam onto the block mask during a waiting period. Therefore, a thermal nonuniformity of a block mask, caused by an electron beam, can be avoided, and thus a high density integrated circuit pattern having a high accuracy can be uniformly formed with a high throughput.

13 Claims, 10 Drawing Sheets

CHARGED PARTICLE BEAM EXPOSURE DEVICE FOR IMPROVING THE HEATING STATE OF BLOCK MASK

BACKGROUND OF THE INVENTION

1. Field of the Invention

The present invention relates to an exposure device, more particularly, to a charged particle beam exposure device using a charged particle beam such an electron beam or an ion beam.

The charged particle beam exposure device having a block mask, which applies a block exposure method, is used to select one or more minute opening patterns from a plurality of opening patterns (block patterns) formed on the block mask and to irradiate a charged particle beam onto a surface of a substrate which is a semiconductor wafer to be processed.

2. Description of the Related Art

Recent developments in the electron beam exposure method have led to an increased use thereof as a method producing the miniaturized patterns required when manufacturing a high density integrated circuit. Further, an ion beam exposure method has been studied, and the ion beam exposure method can form finer patterns because a scattering in a resist film and a reflection from a substrate of the ion beam exposure method are smaller than that of the electron beam exposure method.

Note, in the electron beam exposure method as mainly used in the prior art, for example, an electron beam having a rectangular sectional shape is scanned and irradiated onto a semiconductor wafer to form specific required patterns. Namely, the specific required patterns are obtained by combining each one shot pattern formed by the rectangular shaped electron beam by each one shot operation. Therefore, an area of the one shot operation should be made small, to meet the need for a miniaturization of the required patterns, and thus the number of shot operations required for a unit area becomes large, and accordingly, the throughput of an exposure process is lowered. To solve these problems, a block exposure method has been provided (for example, with reference to H. C. Pfeiffer et al., IEEE Trans. on Electron Devices, Vol. ED-26 (1979) 663).

Namely, a semiconductor integrated circuit requiring an ultra fine pattern, e.g., 64 M-bit or 256 M-bit DRAM, includes an exposure area where in one or more types of block patterns (basic patterns) formed on a block mask are repeatedly selected and exposed. Note, a shape of each of the block patterns is complex, and a size thereof is miniaturized to be included in a sectional area of a variable rectangular beam. Therefore, if such a block pattern is obtained by a one shot operation, the throughput of the exposure process can be raised. Note, in the block exposure method, the basic patterns (block patterns), which are repeatedly used, are performed on a mask (block mask) as a required number of opening patterns, one or more minute opening patterns are selected therefrom, and the selected opening pattern is used for the one shot operation of an electron beam to thereby form a required pattern on a substrate (semiconductor wafer).

Note, the block mask including a plurality of block patterns is made, for example, of silicon or metal, and a thickness of the center portion where in the block patterns of the block mask are formed is about 10 μm. Further, as described above, different minute block patterns formed on the block mask are selected, and then the charged particle beam shaped by each selected block pattern is successively impinged on to the different positions of the substrate.

In the above described charged particle beam exposure device (block exposure device), during a period for inputting exposure data to the exposure device, a period for transferring the input data, or a period for changing the substrate (semiconductor wafer), the charged particle beam exposure device is adjusted to a specific condition to thus immediately start the exposure operation after the elapse of the above periods. Note, a waiting period caused by a change of the substrate is, for example, more than several dozens of seconds, and further, a waiting period for inputting or transferring exposure data to the exposure device is, very long for example, several dozens of minutes. During these periods, a part of the block mask is continuously irradiated by the electron beam, and therefore, a temperature of a part of the block mask is increased and a warping of the opening pattern is caused by the resultant thermal nonuniformity, and further, a contamination of the block mask is caused by a deposition of the polymerizing materials.

Namely, when the charged particle beam is continuously irradiated onto an area of a block pattern of the block mask, the area including the block pattern having a thickness of about 10 μm may become bent, and a part of the block pattern may be melted and eliminated. Further, when the charged particle beam is continuously irradiated onto an area of the block mask, contamination occurs at the irradiated area. Note, the contaminating materials are generally insulating materials, and an electro-static charge is trapped in these contaminating materials, and thus the charged particle beam passing through the block pattern of the block mask may be curved by the electro-static charge of the contaminating materials. Further, the contaminating materials are also produced on a diaphragm aperture unit provided between the block mask and the substrate, and the charged particle beam passing through the diaphragm aperture unit also may be curved by these contaminating materials of the diaphragm aperture unit. These problems will be explained in detail with reference to FIGS. 1 to 3B.

SUMMARY OF THE INVENTION

An object of the present invention is to provide a charged particle beam exposure device providing a uniform thermal distribution of a block mask held therein. Another object of the present invention is to provide a charged particle beam exposure device by which a contamination of the block mask is avoided. Still another object of the present invention is to provide a charged particle beam exposure device by which an accuracy of the exposure operation is increased.

According to the present invention, there is provided a charged particle beam exposure device having a charged particle optical column for selecting one or more minute block patterns from among a plurality of block patterns formed on a block mask, and for irradiating a charged particle beam having a specific sectional shape determined by the selected block pattern onto a surface of a substrate to be processed, wherein the charged particle beam exposure device comprises: a beam generation unit for generating the charged particle beam; a first beam control unit, provided between the beam generation unit and the block mask, for deflecting and irradiating the charged particle beam generated by the beam generation unit onto the block mask; a second beam control unit, provided between the block mask and the substrate, for deflecting and focusing the charged particle beam having the specific sectional shape onto the surface of the substrate; and a third beam control unit, provided between the beam generation unit and the block mask, for uniformly irradiating the charged particle beam onto the block mask during a waiting period.

The third beam control unit may comprise an enlargement lens provided between the beam generation unit and the block mask, for enlarging and irradiating the charged particle beam onto a specific area including a plurality of block patterns of the block mask, during the waiting period. The third beam control unit may further comprise a control power supply for preventing an operation of enlargement lens during an exposure period, and for controlling the enlargement lens to irradiate the charged particle beam onto the specific area of the block mask during the waiting period. The enlargement lens may be an electromagnetic lens, the control power supply does not supply a current to the electromagnetic lens during the exposure period, and the control power supply may supply an alternating current, having an amplitude which is gradually reduced in accordance with in elapse of time, to the electromagnetic lens from the time of the completion of the waiting period to the start of the exposure period.

The third beam control unit may comprise deflection units, provided between the beam generation unit and the block mask, for scanning and irradiating the charged particle beam onto a specific area including a plurality of block patterns of the block mask, during the waiting period. The waiting period may be a period for inputting exposure data to the charged particle beam exposure device, a period for transferring the input data, or a period for changing the substrate. The beam generation unit may comprise an electron beam gun, and the charged particle beam exposure device may be an electron beam exposure device.

The first beam control unit may comprise: an aperture unit for shaping the sectional shape of the charged particle beam emitted from the beam generation unit; deflection units for deflecting the shaped charged particle beam to be selectively passed through the selected block pattern of the block mask; and a lens provided between the aperture unit and the deflection units to establish an image-formation relationship of the charged particle in the charged particle optical column. The first beam control unit may further comprise: a first collimator lens, provided between the beam generation unit and the aperture unit, for changing the charged particle beam emitted from the beam generation unit to a collimated beam, and for irradiating the collimated beam onto the aperture unit; and a second collimator lens, provided between the deflection units and the block mask, for changing the charged particle beam passed through the deflection units to a collimated beam, and for irradiating the collimated beam onto the block mask.

The second beam control unit may comprise: a focusing lens for focusing an image of the charged particle beam shaped by the block mask; second deflection units for deflecting the charged particle beam passed through the block mask to be returned to an optical axis of the charged particle optical column; a diaphragm aperture unit for adjusting the charged particle beam to match a resolution and a current density of the charged particle beam at the surface of the substrate; and a blanking unit, provided between the block mask and the diaphragm aperture unit, for shifting the charged particle beam passed through the block mask so that it is not irradiated onto the surface of the substrate during the waiting period. The second beam control unit may further comprise: a reduction lens for reducing the charged particle beam as a specific magnification; projection lenses, provided between the diaphragm aperture unit and the substrate, for impinging the charged particle beam passed through the diaphragm aperture unit onto the surface of the substrate; and third deflection units, provided between the diaphragm aperture unit and the substrate, for deflecting and repeatedly irradiating the charged particle beam passed through the diaphragm aperture unit onto different positions of the substrate.

The block mask may be made of silicon or metal, and the substrate may be a semiconductor wafer.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the related art will be explained with reference to FIGS. 1 to 4B.

Figure 1:
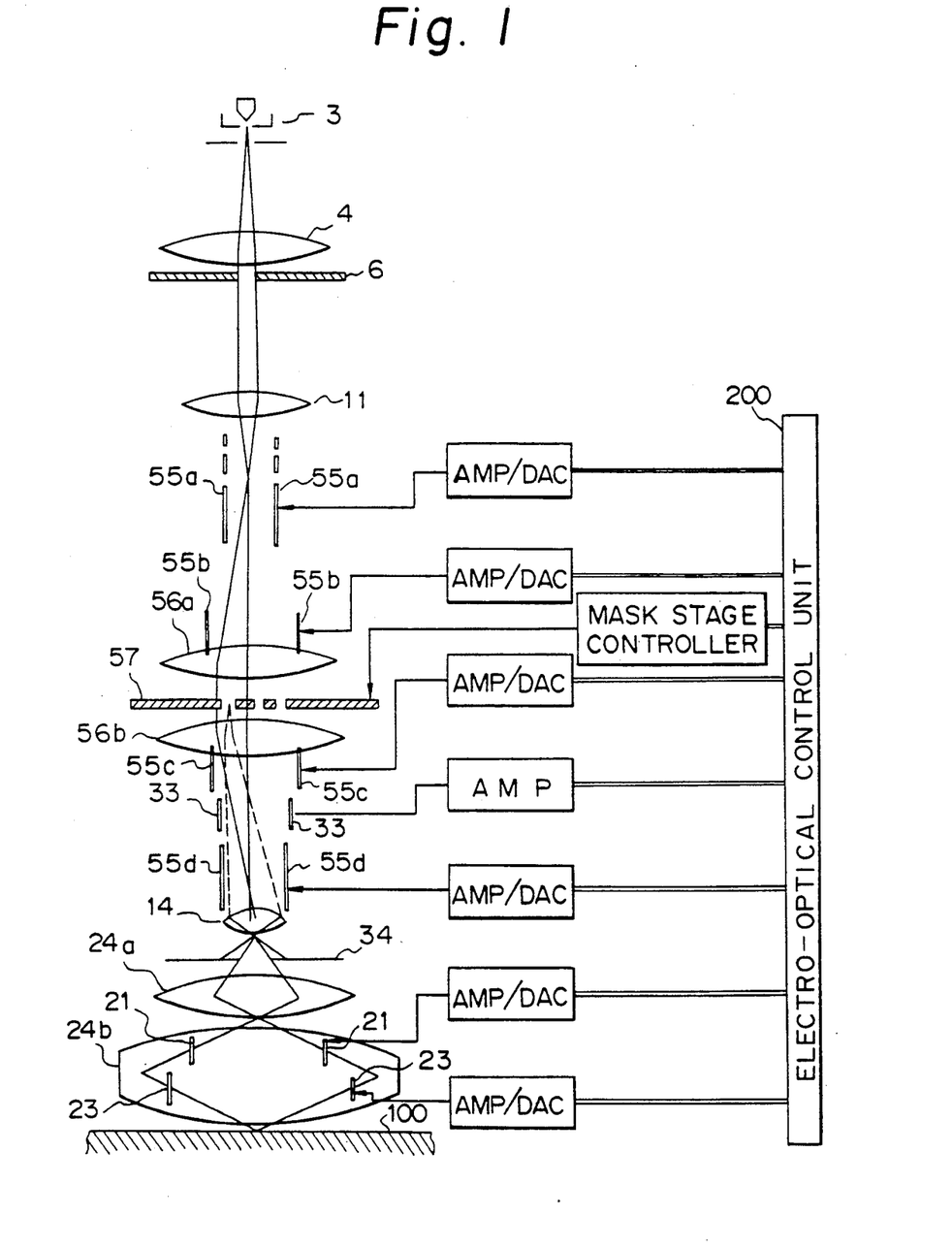
FIG. 1 is a block diagram showing an example of a charged particle beam exposure device according to the related art.

FIG. 1 is a block diagram indicating an example of a charged particle beam exposure device for carrying out a block exposure method according to the related art. In FIG. 1, reference numeral 3 denotes an electron beam gun, 6 denotes an aperture unit having a rectangular aperture, 57 denotes a block mask having a plurality of opening patterns (block patterns), 34 denotes a diaphragm aperture unit, and 100 denotes a substrate (semiconductor wafer). Further, in FIG. 1, reference numerals 4, 11, 56a, 56b, 14, 24a, and 24b denote lenses, and 55a, 55b, 55c, 55d denote deflectors.

As shown in FIG. 1, an electron beam emitted from the electron beam gun 3 is changed to a collimated beam by a collimator lens 4, and then the collimated beam is irradiated onto the aperture unit 6, whereby the collimated beam is given the shape of a rectangular beam having a specific shape and size, by a specific rectangular aperture formed on the aperture unit 6. Further, the shaped collimated beam is passed through the lens 11 to establish an image-formation relationship of the collimated beam in an electro-optical column, and then the collimated beam is deflected by pattern selection deflectors (deflection units) 55a and 55b. Furthermore, the collimated beam is irradiated onto a required block pattern (selected basic pattern) formed on a block mask 57. Note, a collimator lens 56a is provided to change the electron beam irradiated onto the mask 57 to a collimated beam.

Figure 2A:
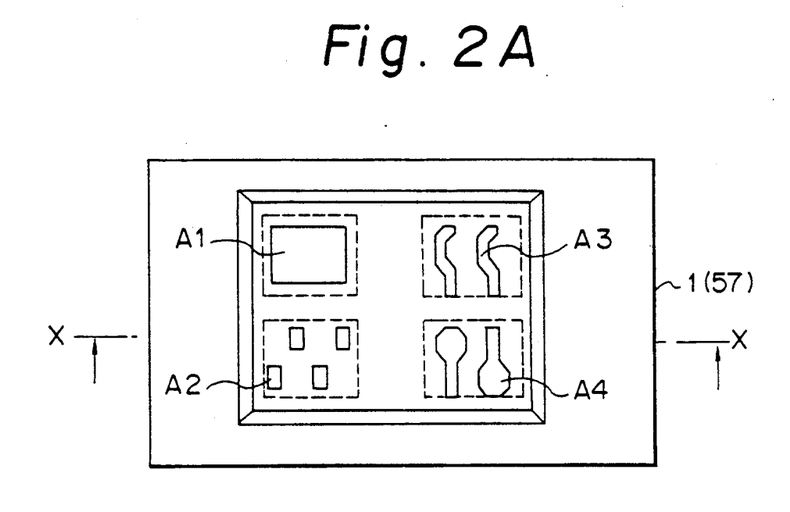
FIGS. 2A and 2B are diagrams showing a block mask used for a charged particle beam exposure device.
Figure 2B:
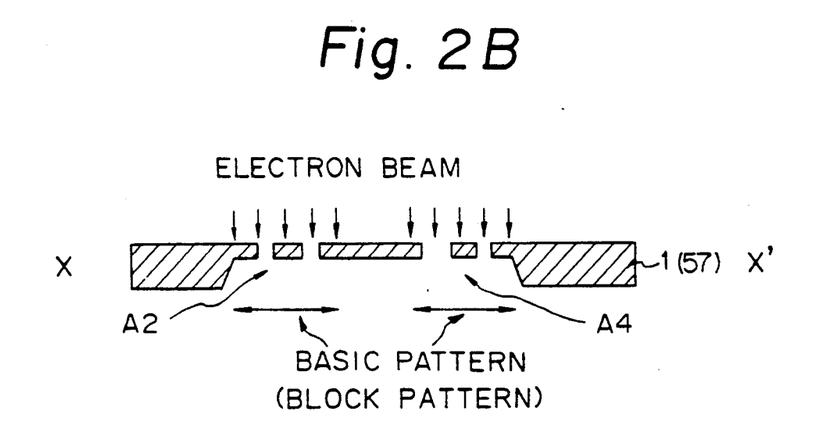

FIG. 2A is a plan view of a block mask 57 used for a charged particle beam exposure device, and FIG. 2B is an end view of the block mask 57 taken along a line X—X' shown in FIG. 2A.

As shown in FIG. 2A, for example, four kinds of basic opening patterns (block patterns) A1, A2, A3, and A4 are formed on the block mask 57. Note, in FIG. 2A, broken lines indicate areas where at the electron beam is irradiated by a one shot operation.

As, shown in FIG. 2B, the block mask 57 is constituted by a substrate 1 made of silicon or metal, and the block patterns A1, A2, A3, and A4 are formed as opening patterns at the center portion of the substrate 1. Note, the thickness of the center portion of the substrate 1 is made about 10 μm, by using an etching method. Further, the block mask 57 is formed by normal lithographic technique used for a electron beam exposure method, a reactive ion etching method, and the like. Furthermore, a plurality of groups each comprising the above described block patterns may be formed on the same mask 57. In this case, a selection of the above groups is carried out by a movement of an X-Y stage on which the mask 57 is mounted.

Again, with reference to FIG. 1, a sectional shape of the electron beam is shaped by a block pattern (basic pattern) selected from the plurality of block patterns on the block mask 57, and an image of the shaped electron beam is focused by the lens (focusing lens) 56b and deflected by deflectors (deflection units) 55c and 55d to be returned to an optical axis of the electro-optical column. Further, the sectional shape of the electron beam is reduced by a specific magnification by a reduction lens 14, and then the electron beam is impinged on a surface of a substrate 100, such as a semiconductor wafer and the like, by projection lenses including lenses 24a and 24b. Note, this electron beam image is deflected and repeatedly irradiated onto different positions of the substrate 100 by deflection units (deflectors) 21 and 22. Further, in the above description, different minute block patterns formed on the block mask 57 can be selected by the deflectors 55a and 55b, and the electron beam shaped by each selected block pattern can be then successively impinged on the different positions of the substrate 100.

Note, in FIG. 1, reference numeral 33 denotes a blanking electrode, provided for deflecting the electron beam passed through the focusing lens 56b so that it is not irradiated onto the surface of the substrate 100 during a transition period of operating the deflection structures or a predetermined waiting period. Further, in FIG. 1, reference numeral 34 denotes a diaphragm aperture unit, provided for adjusting the electron beam passed through the reduction lens 14 to match a resolution and a current density of the electron beam at the surface of the substrate 100. In addition, a road lock structure (not shown in the drawing) is connected to the above described electro optical column through a gate valve (not shown in the drawing), and the block mask 57 can be changed by using the road lock structure and the gate valve.

As shown in FIG. 1, an interface circuit including a D/A converter (DAC) and an amplifier (AMP) is connected to each of the deflectors 55a, 55b, 55c, 55d, the deflection units 21, 23, and the blanking electrode 33, and a specific deflection voltage or a specific deflection current are applied thereto in accordance with an instruction from an electro-optical control unit 200.

In the above-described block exposure device, during a period for inputting exposure data into the electron beam exposure device, a period for transferring the input data, or a period for changing the substrate (semiconductor wafer), the electron beam exposure device is adjusted to specific conditions to immediately start the exposure operation after the elapse of the above periods. For example, when one block pattern is selected, the electron beam is shaped by the aperture unit 6, and the shaped electron beam is maintained in a waiting state in which the electron beam is irradiated onto the block mask 57. Note, the electron beam passed through the block mask 57 is deflected so as not to be input to the projection lens 24a, by the blanking electrode 33, so that the electron beam does not pass through the diaphragm aperture unit 34. Namely, when operating the blanking electrode 33, the electron beam passed through the focusing lens 56b is deflected from the aperture (center portion) of the diaphragm aperture unit 34 to the end portion of the diaphragm aperture unit 34.

Note, a waiting period caused by changing the substrate is, for example, more than several dozens of seconds, and further, a waiting period for inputting or transferring exposure data to the electron beam exposure device is very long, for example, several dozens of minutes. During these periods, a part of the block mask 57 is continuously irradiated by the electron beam, and therefore, a temperature of part of the block mask 57 is increased and a warping of the opening pattern occurs due to a thermal nonuniformity, and further, a contamination of the block mask 57 is caused by the deposition of polymerizing materials.

Figure 3A:
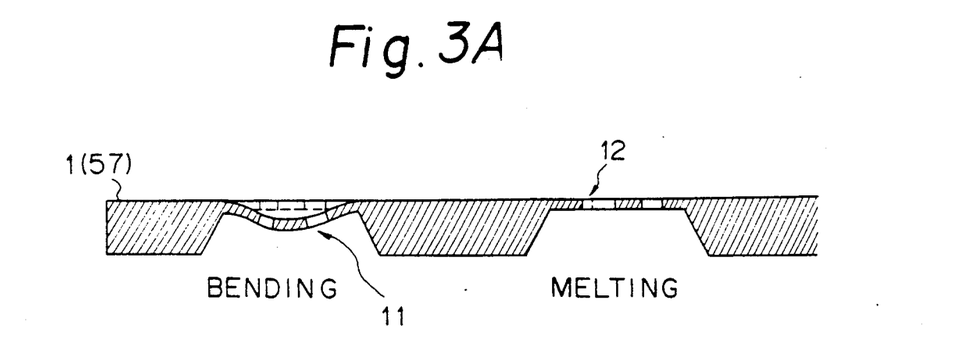
FIGS. 3A and 3B are diagrams for explaining problems arising in the charged particle beam exposure device according to the related art.
Figure 3B:
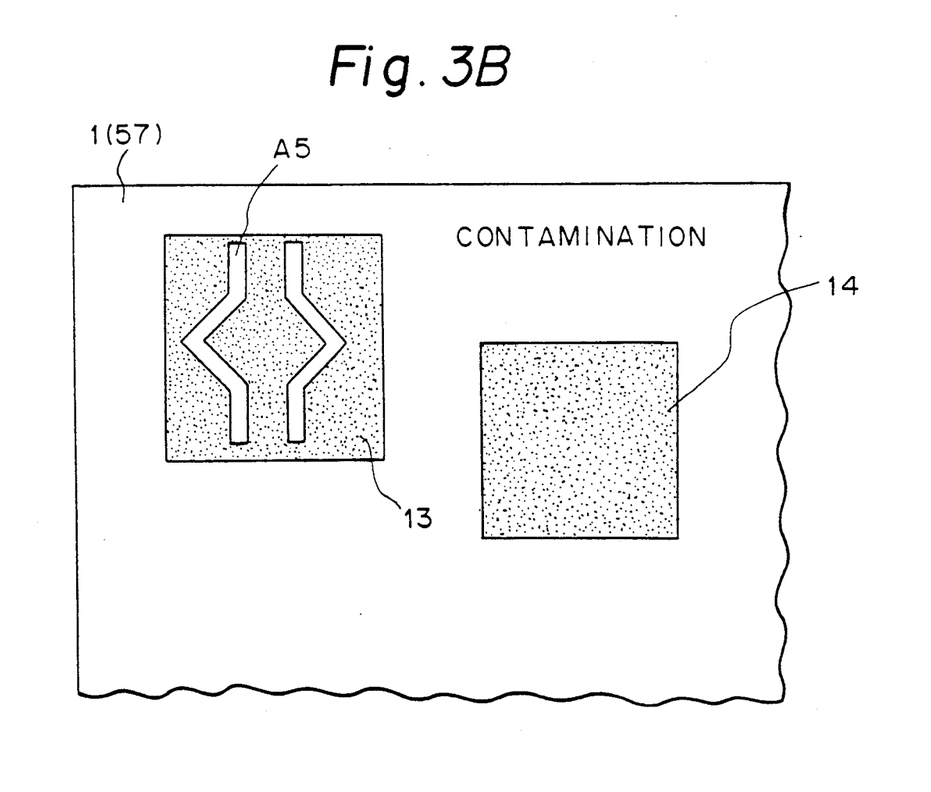

FIGS. 3A and 3B are diagrams for explaining problems arising in the charged particle beam exposure device according to the related art.

As shown in FIG. 3A, when the electron beam is continuously irradiated onto an area of a block pattern of the block mask 57, the area including the block pattern having a thickness of about 10 μm is bent (see reference numeral 11), and a part of the block pattern is melted and eliminated (see reference numeral 12). Namely, when the electron beam is continuously irradiated onto an area including a specific block pattern, a shape of the specific block pattern is changed by a bending or melting thereof.

Further, as shown in FIG. 3B, when the electron beam is continuously irradiated onto a part of the block mask 57, a contamination caused by the deposition of polymerizing materials, e.g., organic gas of the residual gas, is produced at the irradiated area 13 or 14. Namely, when the electron beam is continuously irradiated onto an area 13 including a specific block pattern (A5), a contamination occurs at the irradiated area 13, and further, when the electron beam is continuously irradiated onto an area 14 where no block pattern is provided, contamination occurs at the irradiated area 14. Note, the contaminating materials are generally insulating materials, and an electro static charge (for example, negative electro-static charge caused by the electron beam) is trapped in the contaminating materials corresponding to the irradiated area 13 or 14. Therefore, the electron beam passing through the block pattern of the block mask 57 is curved by the electro static charge of the contaminating materials, and thus the image of the electron beam is distorted.

Further, the contaminating materials are also produced at the diaphragm aperture unit 34, and the electron beam passing through the diaphragm aperture unit 34 is curved by contaminating materials at the diaphragm aperture unit 34, so that the image of the electron beam is distorted.

To solve the above problems, it is considered to drastically move the block mask 57 or to deflect the electron beam above the block mask 57 so that it is not irradiated onto the block patterns of the block mask, but these considerations involve the following problems.

Namely, in the former, an operation for adjusting the position of the electron beam with regard to the block mask 57 would be required, and thus much time is wasted. On the other hand, in the latter, the heating of the block mask 57 is different at the exposure period and at the waiting period, a distortion of the block pattern occurs during the transient period until the exposure operation reaches a constant state, and further, the time required for the exposure operation to reach the constant state is prolonged.

The preferred embodiments of a charged particle beam exposure device according to the present invention are explained, with reference to the accompanying drawings.

Figure 4:
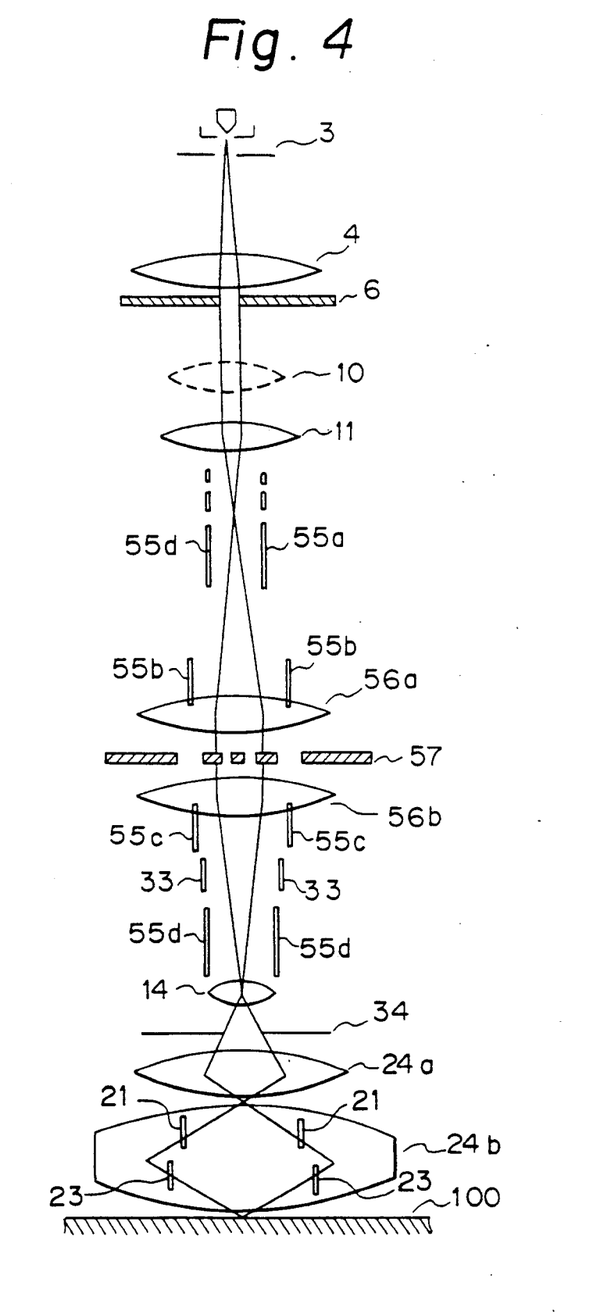
FIG. 4 is a diagram showing an embodiment of a charged particle beam exposure device according to the present invention, when an enlargement lens is not operated.
Figure 5:
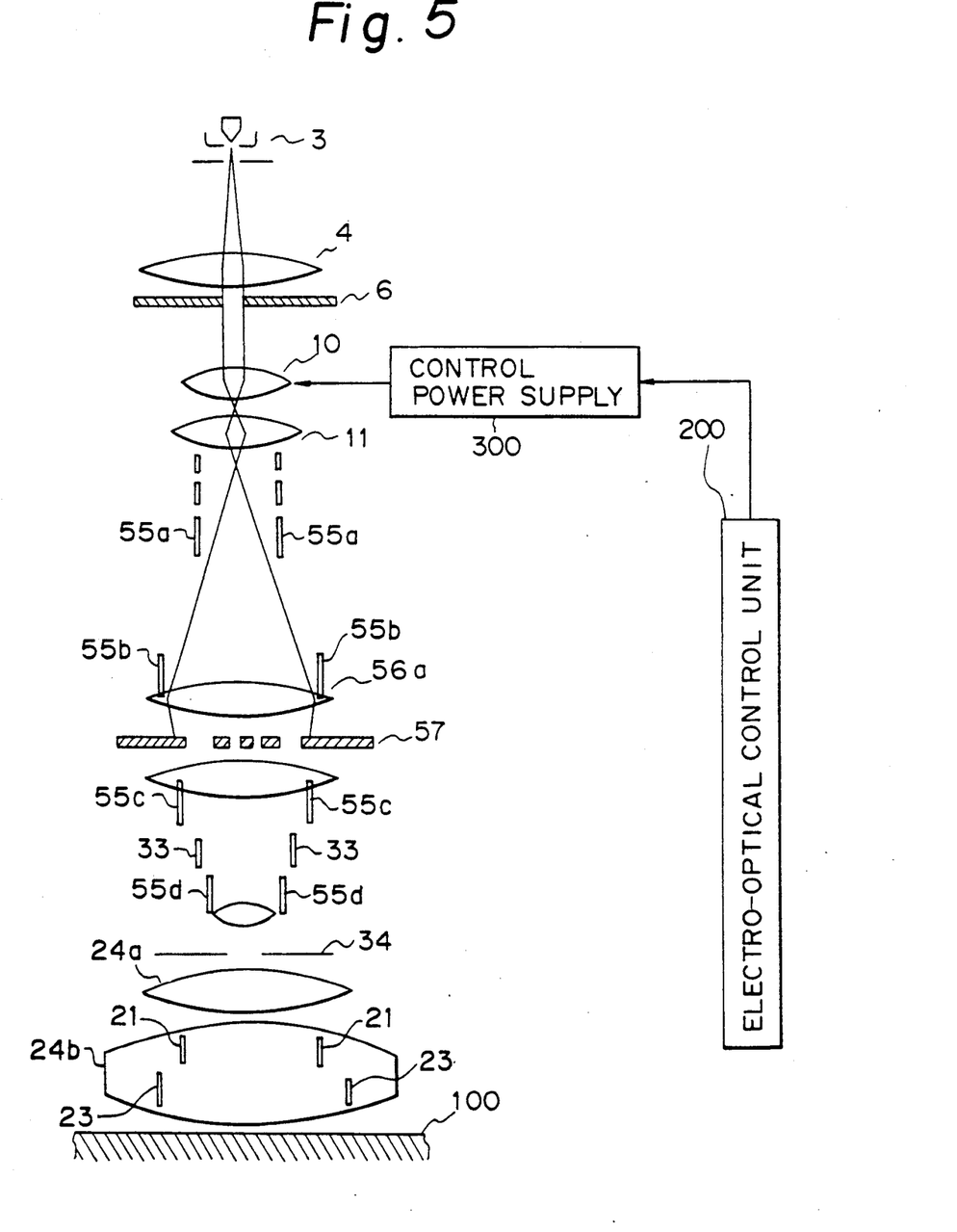
FIG. 5 is a diagram showing an embodiment of a charged particle beam exposure device according to the present invention, when an enlargement lens is operated.

FIGS. 4 and 5 indicate an embodiment of a charged particle beam exposure device according to the present invention, wherein FIG. 4 shows the process when an enlargement lens is not operated, and FIG. 5 shows the process when an enlargement lens is operated.

As shown in FIGS. 4 and 5, reference numeral 10 denotes an enlargement lens, 200 denotes an electron-optical control unit, and 300 denotes a control power supply. When comparing the charged particle beam exposure device (electron beam exposure device) shown in FIGS. 4 and 5 with that shown in FIG. 1, it can be seen that in the electron beam exposure device of the present embodiment, the enlargement lens 10, the electro optical control unit 200, and the control power supply 300 are added to the electron beam exposure device of the related art. Note, the enlargement lens 10 is provided between an aperture unit 6 and a lens 11, and the aperture unit 6 and the lens 11 have the same configuration as in the block exposure device shown in FIG. 1

Namely, as shown in FIGS. 4 and 5, an electron beam emitted from the electron beam gun 3 is changed to a collimated beam by a collimator lens 4, and then the collimated beam is irradiated onto the aperture unit 6, so that the electron beam is formed into a rectangular beam having a specific shape and size, by a specific rectangular aperture formed on the aperture unit 6.

Further, the shaped electron beam is passed through the enlargement lens 10 and the lens 11, to establish an image-formation relationship of the electron beam in an electron-optical column, and then the electron beam is deflected by pattern selection deflectors 55a and 55b.

As shown in FIG. 4, when the enlargement lens 10 is not operated, the electron beam passing through the enlargement lens 10 is input to the lens 11 as a collimated electron beam which is the same as that used in the related art electron beam exposure device shown in FIG. 1. Further, the electron beam is passed through deflectors 55a, 55b and a collimator lens 56a, and then a collimated electron beam is irradiated onto a required block pattern formed on a block mask 57. Note, when the enlargement lens 10 is not operated, the electron beam irradiated onto the mask 57 is the same as that used in the related art electron beam exposure device shown in FIG. 1.

On the other hand, as shown in FIG. 5, when the enlargement lens 10 is operated, the electron beam passing through the enlargement lens 10 is input to the lens 11 as a noncollimated electron beam. Further, the electron beam is passed through the deflectors 55a, 55b and the collimator lens 56a, and then the electron beam is irradiated onto the whole area of the block mask 57. Note, the electron beam irradiated onto the block mask 57 is not a collimated electron beam, namely the electron beam is enlarged and irradiated onto a broad area of the block mask 57. Therefore, the block mask 57 is irradiated by a lower density beam than that of the exposure operation, and the broad area including the selected block pattern is uniformly irradiated by the electron beam, so that a thermal nonuniformity can be lowered and a contamination and a distortion of the block mask 57 do not occur.

Note, as shown in FIGS. 2A and 2B, the block mask 57 has the same configuration as that used for the related art electron beam exposure device shown in FIG. 1, and thus an explanation thereof is omitted.

Further, when the enlargement lens 10 is not operated, a sectional shape of the electron beam is shaped by a block pattern selected from the plurality of block patterns on the block mask 57, and an image of the shaped electron beam is focused by the focusing lens 56b and deflected by deflectors 55c and 55d to be returned to an optical axis of the electro optical column. Further, the sectional shape of the electron beam is reduced by a specific magnification by a reduction lens 14, and then the electron beam is impinged on a surface of a substrate 100 such as a semiconductor wafer and the like, by projection lenses including lenses 24a and 24b. Note, this electron beam image is deflected and repeatedly irradiated onto different positions of the substrate 100 by deflection units 21 and 22. Further, in the above description, different minute block patterns formed on the block mask 57 can be selected by the deflectors 55a and 55b, and then the electron beam shaped by each selected block pattern can be successively impinged on the different positions of the substrate 100. In addition, a road lock structure (not shown in the drawing) is connected to the above described electro optical column through a gate valve (not shown in the drawing), and the block mask 57 can be changed by using the road lock structure and the gate valve.

In FIGS. 4 and 5, reference numeral 33 denotes a blanking electrode provided for deflecting the electron beam passed through the focusing lens 56b so that it is not irradiated onto the surface of the substrate 100 during a transition period of operating the deflection structures or a predetermined waiting period. Further, in FIGS. 4 and 5, reference numeral 34 denotes a diaphragm aperture unit provided for adjusting the electron beam passed through the reduction lens 14 to suit match a resolution and a current density of the electron beam at the surface of the substrate 100. Note, for example, during a waiting time, the electron beam passed through the block mask 57 is deflected so that it is not input to the projection lens 24a by the blanking electrode 33, and thus the electron beam does not pass through the diaphragm aperture unit 34. In this case, the enlargement lens 10 is operated, and thus the end portion of the diaphragm aperture unit 34 is also irradiated by a beam having a lower density than when the enlargement lens 10 is not operated. Therefore, a thermal nonuniformity of the diaphragm aperture unit 34 can be lowered and a contamination and distortion of the diaphragm aperture unit 34 do not occur.

As described above, in the electron beam exposure device of the present embodiment, the enlargement lens 10 is further provided between the aperture unit 6 and the lens 11.

First, as shown in FIG. 4, when the enlargement lens 10 is not operated, i.e., a block exposure operation is carried out, an electron beam is irradiated onto one block pattern from among a plurality of block patterns formed on the block mask 57, and the electron beam pattern passed through the block pattern, i.e., an electron beam image, is irradiated onto a surface of the substrate 100. Note, this electron beam image is deflected and repeatedly irradiated onto different positions of the substrate 100 by deflection units 21 and 23. Further, in the above description, different minute block patterns formed on the block mask 57 can be selected by the deflectors 55a and 55b, and then the electron beam shaped by each selected block pattern can be successively impinged on the different positions of the substrate 100. This exposure operation is the same as that in the electron beam exposure device shown in FIG. 1.

Next, as shown in FIG. 5, when the enlargement lens 10 is operated, i.e., when the electron beam exposure device is maintained in a waiting state, waiting for exposure data to be input to the exposure device, a transfer state for transferring the input data, or a changing state for changing the substrate, the electron beam input to the lens 11 is not a collimated beam. Therefore, the electron beam is not impinged on a specific position in the electro-optical column and irradiated onto a broad area of the block mask 57, i.e., a whole area including a plurality of block patterns is irradiated by the electron beam. Consequently, the block mask 57 is irradiated by a lower density beam than that use for the exposure operation, and further, a broad area including the selected block pattern is uniformly irradiated by the electron beam, so that a thermal nonuniformity can be lowered and a contamination and a distortion of the pattern in the prior art do not occur. Note, as described above, these effects also apply to the diaphragm aperture unit 34.

In the above description, while the enlargement lens 10 is operated, the other lenses 4, 11, 56a, 56b, 14, 24a, 24b, deflectors 55a, 55b, 55c, 55d, and the like are established as the conditions of the exposure operation. Therefore, when the waiting state is finished and the enlargement lens 10 is not operated, an exposure operation can be carried out by stopping the deflection operation of the blanking electrode 33. Note, as described below, a limited time is necessary to stop the enlargement lens 10.

Figure 6:
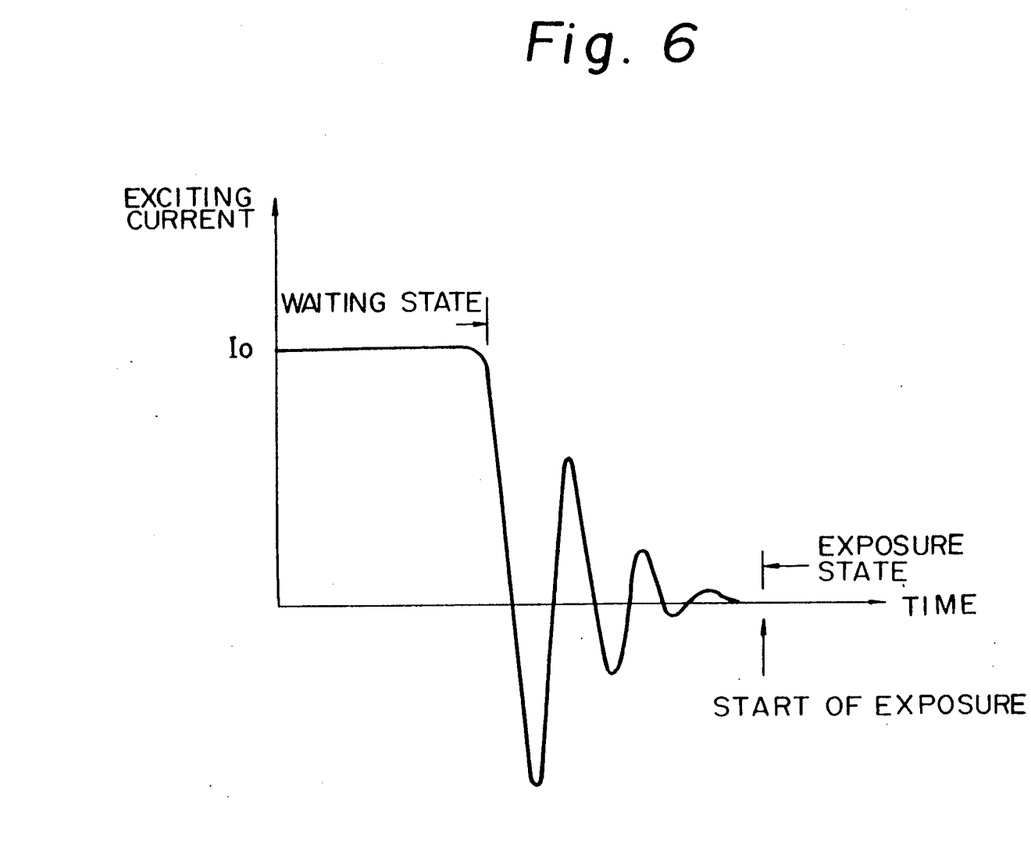
FIG. 6 is a diagram showing an example of a demagnetization method of the enlargement lens shown in FIGS. 4 and 5.

FIG. 6 indicates an example of a demagnetization method of the enlargement lens 10. Namely, in an electromagnetic lens such as an enlargement lens 10, a residual magnetization remains even if an exciting current ($I_0$) used at the exposure operation is cut off. Note, in the exposure device of the present invention, a control power supply 300 is provided for the enlargement lens 10 and supplies an alternating current having an amplitude which is gradually lowered in accordance with an elapse of time to the enlargement lens 10, when the enlargement lens is changed to a non-operational state.

Therefore, the residual magnetization of the enlargement lens remaining at the exposure period can be decreased, and a same block exposure operation as that of the prior art exposure device can be carried out. Note, the time required for demagnetizing the remnant magnetization of the enlargement lens by using this method is generally several seconds. Further, the above residual magnetization cannot be brought to zero, but a residual magnetization liable to cause a focusing error which can be compensated by the lens, e.g., lens 11, can be permitted. In addition, a switching operation between a magnetization and a non-magnetization of the enlargement lens 10, using the control power supply, is carried out by an electro-optical control unit 200 which is the same as that shown in FIG. 1.

Figure 7:
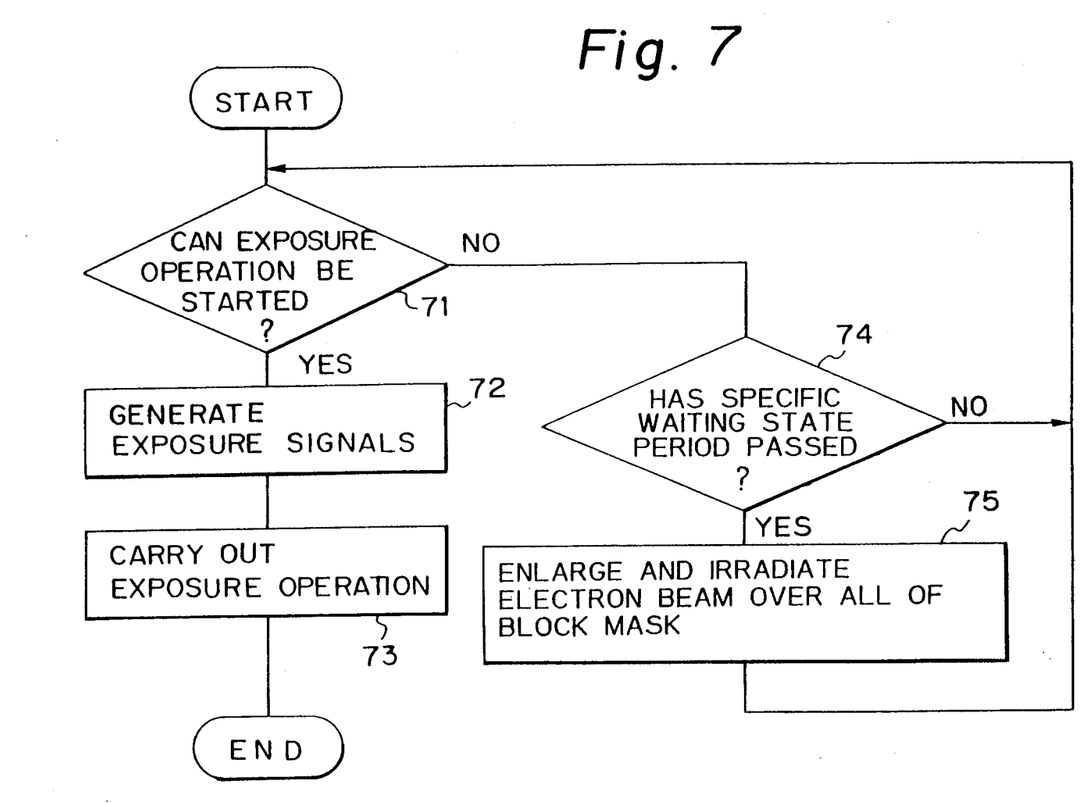
FIG. 7 is a flow chart of an example of an electron beam control process according to the present invention.

FIG. 7 is a flow chart indicating an example of an electron beam control process according to the present invention.

As shown in FIG. 7, in step 71 it is discriminated whether an exposure operation can be started. In step 71, when it is determined that the exposure operation can be started, the flow proceeds to step 72 and exposure signals are generated. Further, the flow proceeds to step 73 and the exposure operation, described above is carried out.

In step 71 if it is determined that the exposure operation cannot be started, the flow proceeds to step 74, and it is determined whether a specific period has elapsed of a waiting state. In step 74, if it is determined whether the specific period has not elapsed of the flow returns to step 71.

In step 74, if it is determined whether the specific period has elapsed, the flow proceeds to step 75 and the electron beam is enlarged and irradiated over all of the block mask. Namely, in this case, the enlargement lens 10 is operated, the electron beam input to the lens 11 is not a collimated beam, and the electron beam is irradiated onto a broad area of the block mask 57, whereby the block mask 57 (diaphragm aperture unit 34) is irradiated by a low density electron beam. Then the flow returns to step 71.

In the electron beam exposure device of the present invention, the electron beam irradiated onto the mask is controlled to be irradiated onto the whole area of the mask including at least one block pattern, during a transfer of input data, a changing of the substrate to be processed, and the like, i.e., longer than a predetermined waiting period, and thus the enlargement lens and the control power supply are added to the block exposure device. Accordingly, the phenomenon of a partial temperature-rise of the mask can be avoided, the contamination of the mask and the warping of the opening pattern do not occur, and thus the accuracy of the exposure pattern is not decreased. Further, unnecessary time can be lowered by thermally stabilizing the mask, and the high accuracy pattern can be exposed at a high throughput.

Figure 8:
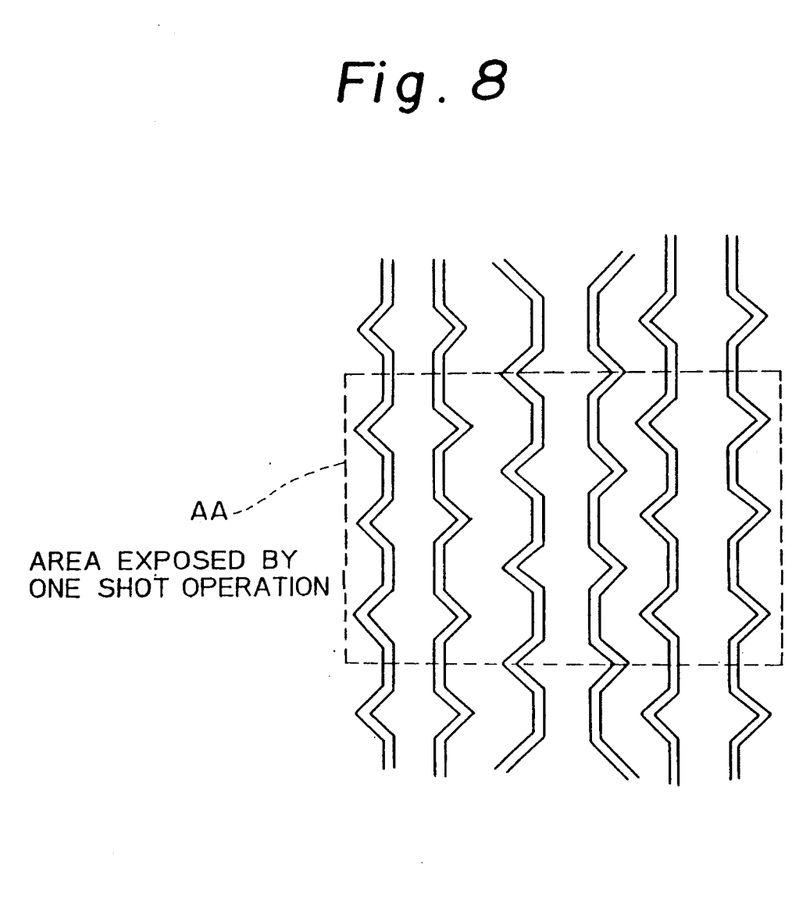
FIG. 8 is a diagram showing an area exposed by one shot operation of a charged particle beam exposure device.

FIG. 8 indicates an area exposed by a one shot operation of a charged particle beam exposure device. As shown in FIG. 8, for example, a 256 M-bit DRAM can be produced by repeatedly carrying out a one shot operation of exposing a specific block pattern and a specific area by the above described electron beam exposure device. Namely, in FIG. 8, reference AA denotes an area exposed by a one shot operation, the area AA including a block pattern for nine memory cells.

In this condition, one semiconductor chip requires $((256 \times 10^6) \div 9)$ shots, and one semiconductor wafer includes, for example, 50 semiconductor chips, therefore:

a required shot number for each semiconductor wafer is $$(256 \times 10^6 \times 50) \div 9 \div 1.4 \times 10^9 [\text{shot/wafer}]$$

when one shot time for an exposure operation is, for example, 200 nano-seconds, a time required for irradiating an electron beam to process one semiconductor wafer is $$1.4 \times 10^9 [\text{shot/wafer}] \times 200 [\text{nsec./shot}] = 280 [\text{sec./wafer}]$$

and further, a time required for changing and positioning a semiconductor wafer is about 80 [sec./wafer], and therefore, a time required for processing one wafer is about 360 [sec./wafer], and consequently, 10 wafers can be processed in one hour.

Figure 9:
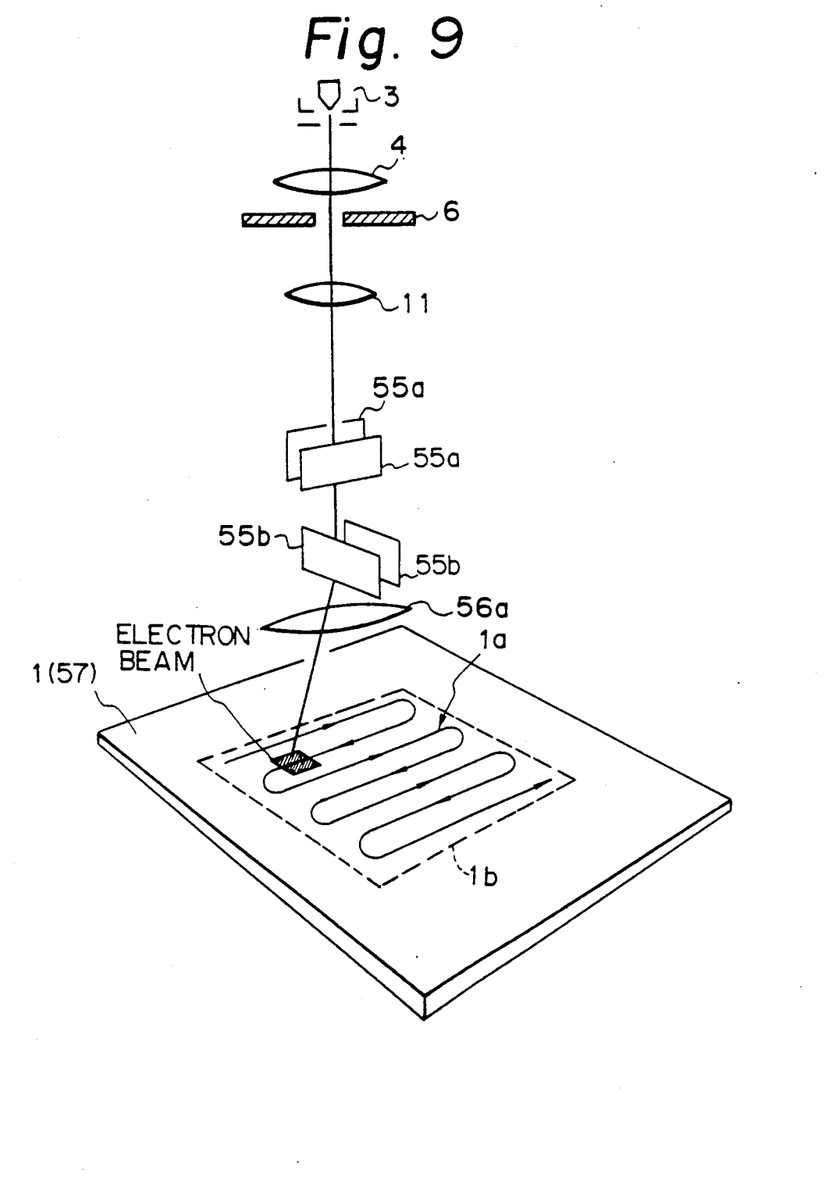
FIG. 9 is a diagram for explaining another embodiment of a charged particle beam exposure device according to the present invention.

FIG. 9 is a diagram for explaining another embodiment of a charged particle beam exposure device according to the present invention.

In FIG. 9, instead of providing the enlargement lens 10 shown in FIGS. 4 and 5, and operating the enlargement lens 10 to enlarge and irradiate an electron beam onto a whole area of a block mask 57, the electron beam passed through a lens 11 is scanned over the whole area of the block mask 57 during a waiting period. Namely, when the electron beam exposure device is maintained in a waiting state while waiting for exposure data to be input to the exposure device, a transfer state for transferring the input data, or a changing state for changing the substrate, corresponding to the periods when the enlargement lens 10 is operated in the former embodiments shown in FIGS. 4 and 5, the electron beam input to the lens 11 is deflected by deflectors 55a and 55b to scan a broad area of the block mask 57 having a plurality of block patterns therein.

Note, in FIG. 9, the area of the block mask 57 scanned by the electron beam of this embodiment corresponds to that irradiated by the enlarged electron beam by the enlargement lens 10. Therefore, in this embodiment, effects similar to those of the former embodiments explained with reference to FIGS. 4 and 5 can be obtained. Namely, in this embodiment, the electron beam is scanned and irradiated onto a whole area of the block mask 57 by the deflectors 55a and 55b, and thus each portion of the block mask 57 is uniformly irradiated in a short time, and accordingly, the thermal nonuniformity can be lowered and a contamination and a distortion of the block mask 57 do not occur. Further, a thermal nonuniformity of the diaphragm aperture unit 34 can be lowered and a contamination and a distortion of the diaphragm aperture unit 34 do not occur, and the same effect can be given to the block mask 57.

Figure 10:
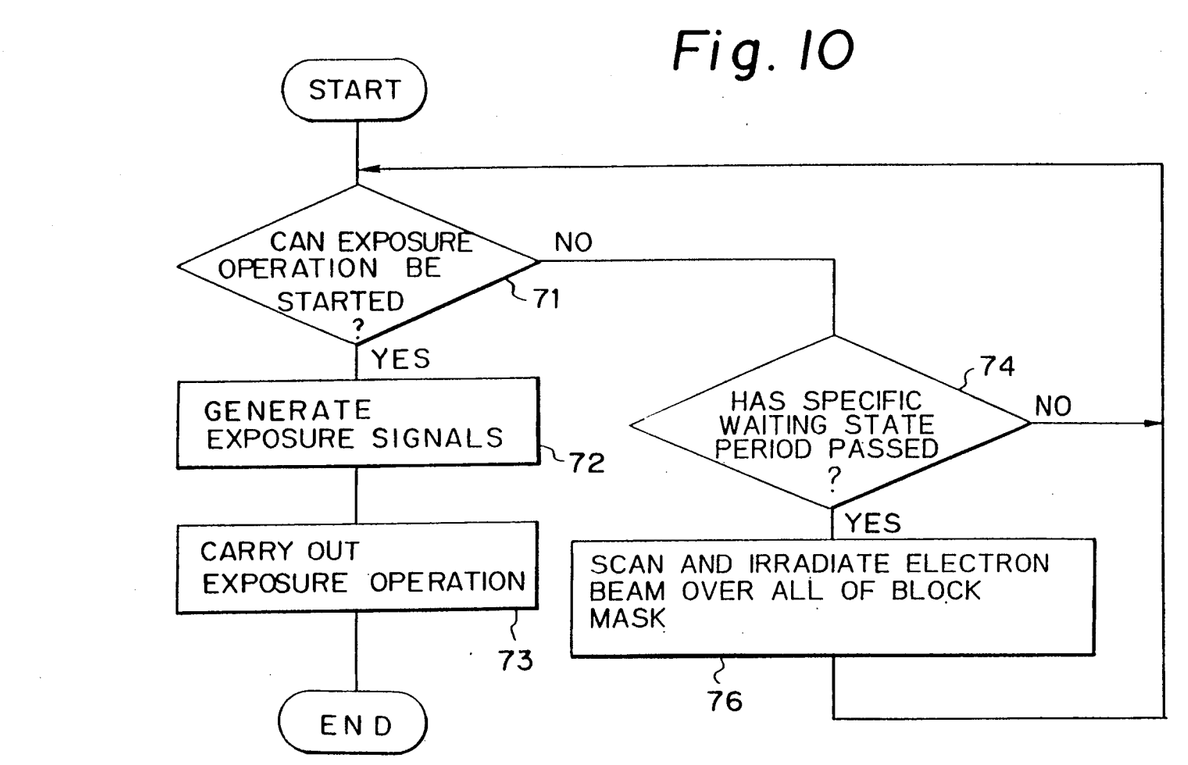
FIG. 10 is a flow chart showing another example of an electron beam control process according to the present invention.

FIG. 10 is a flow chart indicating another example (with reference to FIG. 9) of an electron beam control process according to the present invention.

When comparing the flow chart shown in FIG. 10 with that shown in FIG. 8, it can be seen that step 75 in FIG. 8 is changed to step 76 in FIG. 10. Namely, as shown in FIGS. 9 and 10, in step 71 it is determined whether an exposure operation can be started. In step 71, if it is determined that the exposure operation can be started, the flow proceeds to step 72 and exposure signals are generated. Further, the flow proceeds to step 73 the exposure operation described above is carried out.

In step 71, if it is determined that the exposure operation cannot be started, the flow proceeds to step 74, and further, it is determined whether a specific period have elapsed at a waiting state. In step 74, if it is determined that the specific period has not elapsed, the flow returns to step 71.

In step 74, f it is determined that the specific period has elapsed, the flow proceeds to step 76, and the electron beam is scanned and irradiated over all of the block mask. Namely, in this case, the electron beam input to the lens 11 is deflected by the deflectors 55a and 55b to scan a broad area of the block mask 57 in which a plurality of block patterns are formed. Therefore, each portion of the block mask 57 is uniformly irradiated in a short time, whereby a thermal nonuniformity is lowered and a contamination and distortion of the block mask 57 do not occur. As described above, these effects also apply to the diaphragm aperture unit 34.

Note, the above embodiments are related only to an electron beam exposure device, but the present invention also can be applied to a charged particle beam exposure device carrying out a block exposure method by using an ion beam.

As described above, in accordance with a charged particle beam exposure device of the present invention, an enlargement lens and a control power supply for controlling the enlargement lens are added to the charged particle beam exposure device of the related art, whereby a thermal nonuniformity of a block mask caused by an electron beam can be avoided during a waiting period, and thus a high density integrated circuit pattern having a high accuracy can be uniformly formed at a high throughput.

Further, in accordance with a charged particle beam exposure device of the present invention, an electron beam is scanned and irradiated over all of the block mask during a waiting period, and therefore, each portion of the block mask is uniformly irradiated in a short time, whereby a thermal nonuniformity can be lowered and a contamination and a distortion of the block mask do not occur. Note, these effects are also applied to the diaphragm aperture unit.

Many widely differing embodiments of the present invention may be constructed without departing from the spirit and scope of the present invention, and it should be understood that the present invention is not limited to the specific embodiments described in this specification, except as defined in the appended claims.

I claim:

1. A charged particle beam exposure device having a charged particle optical column for selecting one or more minute block patterns from a plurality of block patterns formed on a block mask, and for irradiating a .

charged particle beam having a specific sectional shape determined by said selected block pattern onto a surface of a substrate to be processed, wherein said charged particle beam exposure device comprises:

a beam generation means for generating said charged particle beam;

a first beam control means, provided between said beam generation means and said block mask, for deflecting and irradiating said charged particle beam generated by said beam generation means onto said block mask;

a second beam control means, provided between said block mask and said substrate, for deflecting and focusing said charged particle beam having said specific sectional shape onto the surface of said substrate; and a third beam control means, provided between said beam generation means and said block mask, for uniformly irradiating said charged particle beam onto said block mask during a waiting period.

2. A charged particle beam exposure device as claimed in claim 1, wherein said third beam control means comprises an enlargement lens provided between said beam generation means and said block mask, for enlarging and irradiating said charged particle beam onto a specific area including a plurality of block patterns of said block mask during said waiting period.

3. A charged particle beam exposure device as claimed in claim 2, wherein said third beam control means further comprises a control power supply for controlling said enlargement lens so that it does not operate during an exposure period, and for controlling said enlargement lens to irradiate said charged particle beam onto said specific area of said block mask during said waiting period.

4. A charged particle beam exposure device as claimed in claim 3, wherein said enlargement lens is an electromagnetic lens, said control power supply does not supply a current to said electromagnetic lens during said exposure period, and said control power supply supplies an alternating current having an amplitude which is gradually lowered in accordance with time elapsing to said electromagnetic lens from a completion of said waiting period to a starting of said exposure period.

5. A charged particle beam exposure device as claimed in claim 1, wherein said third beam control means comprises deflection means, provided between said beam generation means and said block mask, for scanning and irradiating said charged particle beam onto a specific area including a plurality of block patterns of said block mask during said waiting period.

6. A charged particle beam exposure device as claimed in claim 1, wherein said waiting period is a period for inputting exposure data to said charged particle beam exposure device, a period for transferring the input data, or a period for changing said substrate.

7. A charged particle beam exposure device as claimed in claim 1, wherein said beam generation means comprises an electron beam gun, and said charged particle beam exposure device is an electron beam exposure device.

8. A charged particle beam exposure device as claimed in claim 1, wherein said first beam control means comprises:

an aperture means for shaping the sectional shape of said charged particle beam emitted from said beam generation means;

deflection means for deflecting said shaped charged particle beam to selectively pass through said selected block pattern of said block mask; and a lens provided between said aperture means and said deflection means to establish an image-formation relationship of the charged particle in said charged particle optical column.

9. A charged particle beam exposure device as claimed in claim 8, wherein said first beam control means further comprises:

a first collimator lens, provided between said beam generation means and said aperture means, for changing said charged particle beam emitted from said beam generation means to a collimated beam and for irradiating the collimated beam onto said aperture means; and a second collimator lens, provided between said deflection means and said block mask, for changing said charged particle beam passed through said deflection means to a collimated beam and for irradiating the collimated beam onto said block mask.

10. A charged particle beam exposure device as claimed in claim 1, wherein said second beam control means comprises:

a focusing lens for focusing an image of said charged particle beam shaped by said block mask;

second deflection means for deflecting said charged particle beam passed through said block mask to be returned to an optical axis of said charged particle optical column;

a diaphragm aperture means for adjusting said charged particle beam to match a resolution and a current density of said charged particle beam at the surface of said substrate; and a blanking means, provided between said block mask and said diaphragm aperture means, for shifting said charged particle beam passed through said block mask so that it is not irradiated onto the surface of said substrate during said waiting period.

11. A charged particle beam exposure device as claimed in claim 10, wherein said second beam control means further comprises:

a reduction lens for reducing said charged particle beam by a specific magnification;

projection lenses, provided between said diaphragm aperture means and said substrate, for impinging said charged particle beam passed through said diaphragm aperture means onto the surface of said substrate; and third deflection means, provided between said diaphragm aperture means and said substrate, for deflecting and repeatedly irradiating said charged particle beam passed through said diaphragm aperture means onto different positions of said substrate.

12. A charged particle beam exposure device as claimed in claim 1, wherein said block mask is made of silicon or metal.

13. A charged particle beam exposure device as claimed in claim 1, wherein said substrate is a semiconductor wafer.

* * * * *

UNITED STATES PATENT AND TRADEMARK OFFICE
CERTIFICATE OF CORRECTION

PATENT NO. : 5,177,365
DATED : January 5, 1993
INVENTOR(S) : Akio YAMADA

It is certified that error appears in the above-indentified patent and that said Letters Patent is hereby corrected as shown below:

Title PAGE: [57] ABSTRACT, line 5, change "sectional" to --cross-sectional--.

Col. 1, line 56, change "performed" to --pre-formed--.

Col. 5, line 44, change "sectional" to --cross-sectional--;
line 51, change "sectional" to --cross-sectional--.

Col. 7, line 9, change "electro static" to --electro-static--.

Col. 8, line 41, change "sectional" to --cross-sectional--;
line 47, change "sectional" to --cross-sectional--.

Col. 9, line 50, after "and" insert --instead is--.

Col. 10, line 44, after "elapsed" insert --,-- and delete "of".

Col. 11, line 20, change "$\div$" (second occurence) to --$\approx$--, the resulting equation should read: --$(256 \times 10^6 \times 50) \div 9 \approx 1.4 \times 10^9$ [shot/wafer].--;
line 22, change "when" to --When--;
lines 24, 25 & 26, delete the indention.

Col. 12, line 17, change "have" to --has--;
line 22, change "f it is" to --if it is--.

UNITED STATES PATENT AND TRADEMARK OFFICE
CERTIFICATE OF CORRECTION

PATENT NO. : 5,177,365
DATED : January 5, 1993
INVENTOR(S) : Akio YAMADA

It is certified that error appears in the above-indentified patent and that said Letters Patent is hereby corrected as shown below:

Col. 13, line 1, change "sectional" to --cross-sectional--;
line 15, change "sectional" to --cross-sectional--.

Signed and Sealed this

Sixteenth Day of August, 1994

Attest:

BRUCE LEHMAN

Attesting Officer    Commissioner of Patents and Trademarks